United States Patent [19]

Furuhata et al.

[11] Patent Number: 5,164,877
[45] Date of Patent: Nov. 17, 1992

[54] SEMICONDUCTOR DEVICE

[75] Inventors: Shooichi Furuhata; Susumu Kobayashi, both of Matumoto, Japan

[73] Assignee: Fuji Electric Co., Ltd., Japan

[21] Appl. No.: 659,995

[22] Filed: Feb. 22, 1991

[30] Foreign Application Priority Data

Feb. 23, 1990 [JP] Japan .................................. 2-43055
Mar. 30, 1990 [JP] Japan .................................. 2-84254

[51] Int. Cl.⁵ .............................................. H02H 3/20
[52] U.S. Cl. ...................................... 361/111; 361/18; 363/50
[58] Field of Search .................... 361/18, 111; 363/50; 357/23.4, 35

[56] References Cited

U.S. PATENT DOCUMENTS 4,635,158  1/1987  Riley ................................. 361/111
4,791,521 12/1988  Ouyang et al. ..................... 361/91
4,825,279  4/1989  Furuhata ............................ 357/68

FOREIGN PATENT DOCUMENTS 3734067  5/1988  Fed. Rep. of Germany.
0092243  6/1983  Japan ................................. 357/74
0678585  8/1979  U.S.S.R. ............................. 361/18

OTHER PUBLICATIONS

"Mospower Applications Handbook", Siliconix Incorporated, Santa Clara, Calif. 95054, pp. 5-15 to 5-23 and 5-67 to 5-68, 1984.

Primary Examiner—Steven L. Stephan
Assistant Examiner—Thomas M. Dougherty
Attorney, Agent, or Firm—Brumbaugh, Graves, Donohue & Raymond

[57] ABSTRACT

To provide for surge protection in fast-acting semiconductor devices, e.g., power transistors, MOSFET's, and IGBT's a device can be designed to produce a self-induced electromotive voltage which counteracts a surge. To this end, a preferred arrangement of electrical terminals is disclosed, as well as preferred shapes of such terminals.

15 Claims, 4 Drawing Sheets

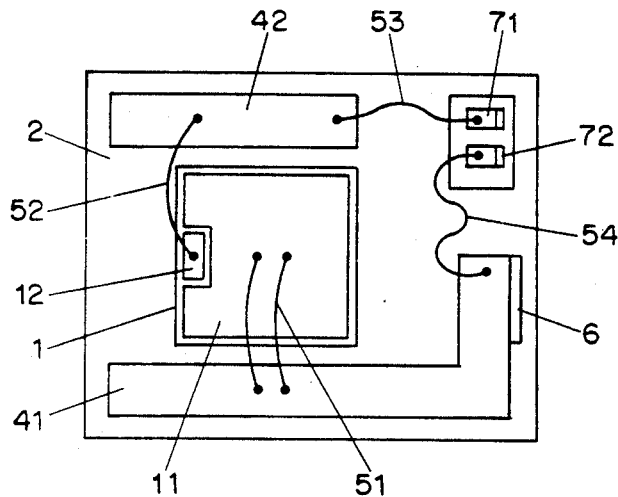
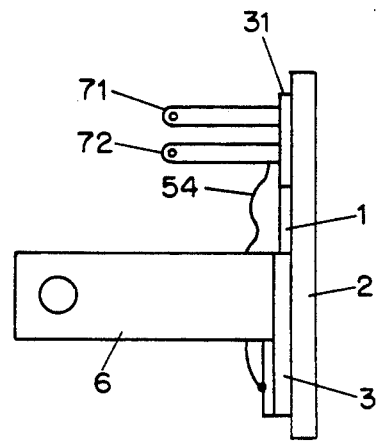
FIG. 1(a)   FIG. 1(b)
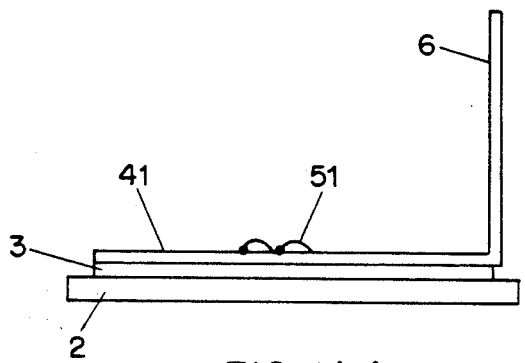
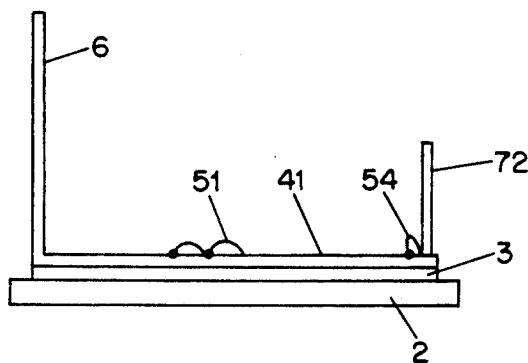
FIG. 1(c)   FIG. 2(c)
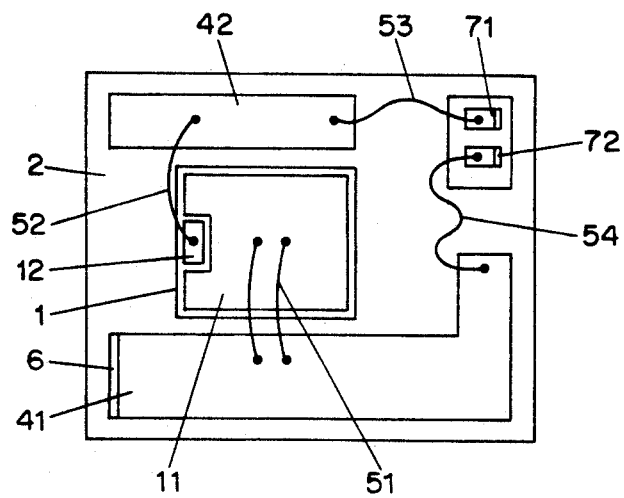
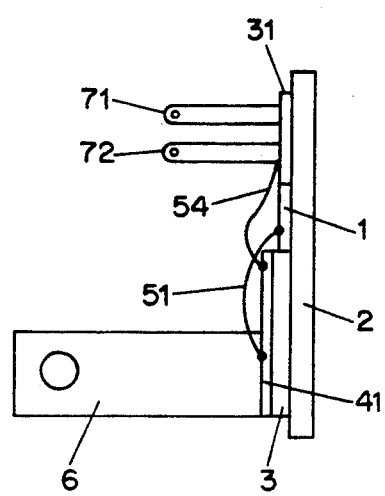
FIG. 2(a)   FIG. 2(b)

SEMICONDUCTOR DEVICE

TECHNICAL FIELD

The present invention relates to semiconductor devices that include electrodes.

BACKGROUND OF THE INVENTION

Semiconductor devices of particular interest include switching elements for controlling current flow between two main electrodes, with current control involving the application of a control signal between a control electrode and one of the main electrodes. Among such devices are power transistors, MOSFET's (metal-oxide-semiconductor field-effect transistors), and IGBT's (insulated-gate bipolar transistors.)

To couple a main electrode or a control electrode formed on the surface of a semiconductor element to an external circuit, such electrode is connected to an output terminal via a relatively wide, belt-shaped insulated band conductor affixed to the same support plate as the semiconductor element. An electrode and a band conductor can be connected together by an ordinary lead wire, and band conductor and an output terminal can be connected together either by attaching the output terminal directly to the band conductor, or by means of a lead wire.

FIG. 2 shows a semiconductor device in which the semiconductor element forms an IGBT. In the case of FIG. 2, which does not use the present invention, (a) is a top view, (b) is a front view, and (c) is a side view. The IGBT semiconductor element 1 is affixed to a metal support plate 2 by means of a collector electrode on the bottom of the semiconductor element. On the surface of the metal support plate 2, a band conductor 41 is affixed on an insulating layer 3, and a band conductor 42 is affixed on an insulating layer which is not visible. An emitter main electrode 11 on top of the semiconductor element 1 is connected to the band conductor 41 by lead wire 51, and a gate control electrode 12 is connected to the band conductor 42 by lead wire 52. One end of the band conductor 41 rises up to form a main emitter terminal 6. Moreover, on the support plate 2, first and second auxiliary terminals 71 and 72 are affixed on an insulating layer 31. The first auxiliary terminal 71 is connected to the band conductor 42 by a lead wire 53, thereby forming a gate terminal, and the second auxiliary terminal 72 is connected to the band conductor 41 by a lead wire 54, thereby forming an auxiliary emitter terminal.

Motivated by recent demand for low-loss power switching elements, device operating resistance has been reduced by inclusion of a micro-pattern formed on the surface of a semiconductor element. As a further benefit of such inclusion, turn-on characteristics are enhanced. However, especially in cases of electric power handling, rapid turn-on is accompanied by a voltage surge, L·di/dt (where i stands for current, t for time, and L for the inductance of interconnections in the semiconductor device), and a voltage surge exceeding the rated voltage of an element may result in damage to the element. Such damage may also occur upon turn-off when, due to improved turn-off characteristics, di/dt is large in magnitude.

FIG. 3 shows an equivalent circuit for the semiconductor device of FIG. 2, where respective parts are numbered as in FIG. 2. When a positive voltage is applied to the gate terminal 71 and a negative voltage to the auxiliary emitter terminal 72, the IGBT element 1 is turned on, and the collector current 21 is proportional to the voltage between terminals 71 and 72. However, if the response speed of element 1 is too fast, the collector current 21 rises excessively. As a result, the voltage surge produced as the product of di/dt and the main-electrode interconnection inductance 22 becomes excessive. To prevent this, a resistor is connected in series to a gate terminal g, so that rise of a voltage between the gate electrode 12 and the emitter electrode 11 of element 1 is limited by a time constant which depends on the inherent capacitances 23 and 24 between the resistor and the element. This arrangement prevents the collector current from changing excessively upon start-up and shutdown. However, there are drawbacks in that a voltage signal reaching the gate is delayed, and in that the emitter voltage required to turn on a collector current 21 is large. Moreover, upon shutdown, the gate delay is long also, and the emitter voltage drop large.

SUMMARY OF THE INVENTION

A semiconductor (switching) device is provided with self-induced protection against surges (during switching). A preferred device includes conductor means having an inductance which produces an electromotive voltage during turn-on and turn-off, and terminal means which are disposed such that a portion of such voltage is applied in opposition to a control signal.

BRIEF DESCRIPTION OF THE DRAWING

FIG. 1 shows an IGBT according to a preferred first embodiment of the present invention—in top view (a), front view (b), and side view (c);

FIG. 2 shows an IGBT as used in a conventional semiconductor device—in top view (a), front view (b), and side view (c);

Figure 3:
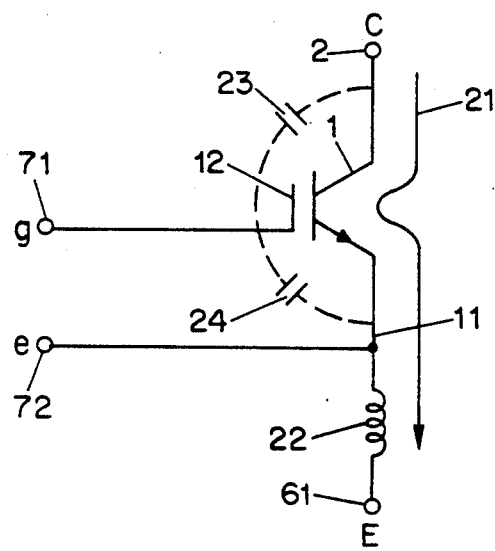
FIG. 3 is an equivalent circuit diagram for the IGBT of FIG. 2.

Some frequently used designations are as follows:
1—IGBT semiconductor element,
11—Emitter electrode,
12—Gate electrode,
41, 42—Band conductors,
51, 52, 53, 54—Lead wires,
6—Main emitter terminal,
71—Gate terminal,
72—Auxiliary emitter terminal.

DETAILED DESCRIPTION OF THE EMBODIMENTS

It is an object of the present invention to provide a semiconductor device which is protected against damage due to voltage surges caused by the internal wiring upon start-up or shutdown in cases where a switching element is included which has a fast turn-on/turn-off response. Simultaneously, this invention prevents excessive time delay at start-up or shutdown.

In a preferred embodiment of the invention, a rapid rise or fall of a control voltage is suppressed, and an excessive voltage surge is prevented by an opposing electromotive voltage, generated by main-electrode interconnections upon turn-on or turn-off; such opposing voltage is produced when a main terminal is located close to an auxiliary terminal.

In a specific preferred embodiment, a semiconductor element affixed to a support plate has a control electrode connected to a first auxiliary terminal, and a main electrode connected both to a main terminal and to a second auxiliary terminal. The terminals rise vertically from the support plate and have wire connections to respective electrodes. The wire connection to the second auxiliary terminal is connected at a wire terminal located on the main terminal and near the base of the main terminal. This wire connection controls the main current by application of a voltage between the first and second auxiliary terminals.

An electromotive voltage, generated by the main current and the inductance of the interconnection to the main electrode, is applied between the first and second auxiliary terminals, thereby influencing and opposing the control voltage between the first and second auxiliary terminals. Thus, any voltage surge due to the inductance of the interconnection and a change in the main current is suppressed.

FIG. 1 shows a preferred embodiment of the invention in the form of an IGBT, where respective parts are numbered as in FIG. 2. The IGBT semiconductor element 1 is affixed, with a collector electrode beneath, to the metal support plate 2 The emitter electrode 11 is connected to the band conductor 41 by a lead wire 51. The gate electrode 12 is connected to the band conductor 42 by the lead wire 52, similar to FIG. 2. Also, as in FIG. 2, terminal 71 rises from the insulating layer 31 on support plate 2 and is connected to band conductor 42 by lead wire 53, and the auxiliary emitter terminal 72 is connected to band conductor 41 by lead wire 54. However, unlike FIG. 2, the main emitter terminal 6 rises from an end of the band conductor 41 near a connection point with the lead wire 54.

Figure 4:
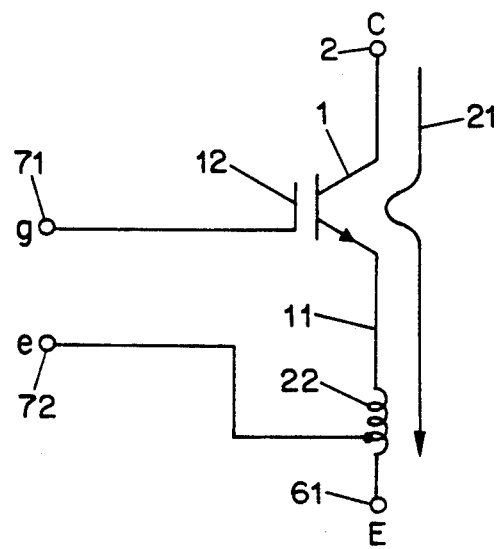
FIG. 4 is an equivalent circuit diagram for the IGBT of FIG. 1.

A corresponding equivalent circuit is shown in FIG. 4 where respective parts are numbered as in FIG. 3. But, now the connection point of the auxiliary emitter terminal 72 with the IGBT element 1 is on the interconnection inductance 22 stemming from lead wire 51 and band conductor 41. As a result, an opposing electromotive voltage—due to the collector current 21 and a main-electrode interconnection inductance 22 of more than 20 nH—reacts on the voltage applied between the "g"-terminal 71 and the "e"-terminal 72 to reduce the rate of increase of the voltage between the gate electrode 12 and the emitter electrode 11 of element 1. Even if a voltage with a fast rate of increase is applied between "g". and "e" terminals 71 and 72, the voltage between the gate and emitter electrodes 12 and 11 of the element rises more slowly, as its rate of change is diminished by an opposing electromotive voltage generated by the interconnection inductance 22 and the collector current 21. Proportionately, the rate of increase of the collector current 21 is also diminished. And similarly, a corresponding effect counteracts a rapid voltage decrease between electrodes 11 and 12, thus preventing a rapid decrease in the collector current 21.

Figure 5:
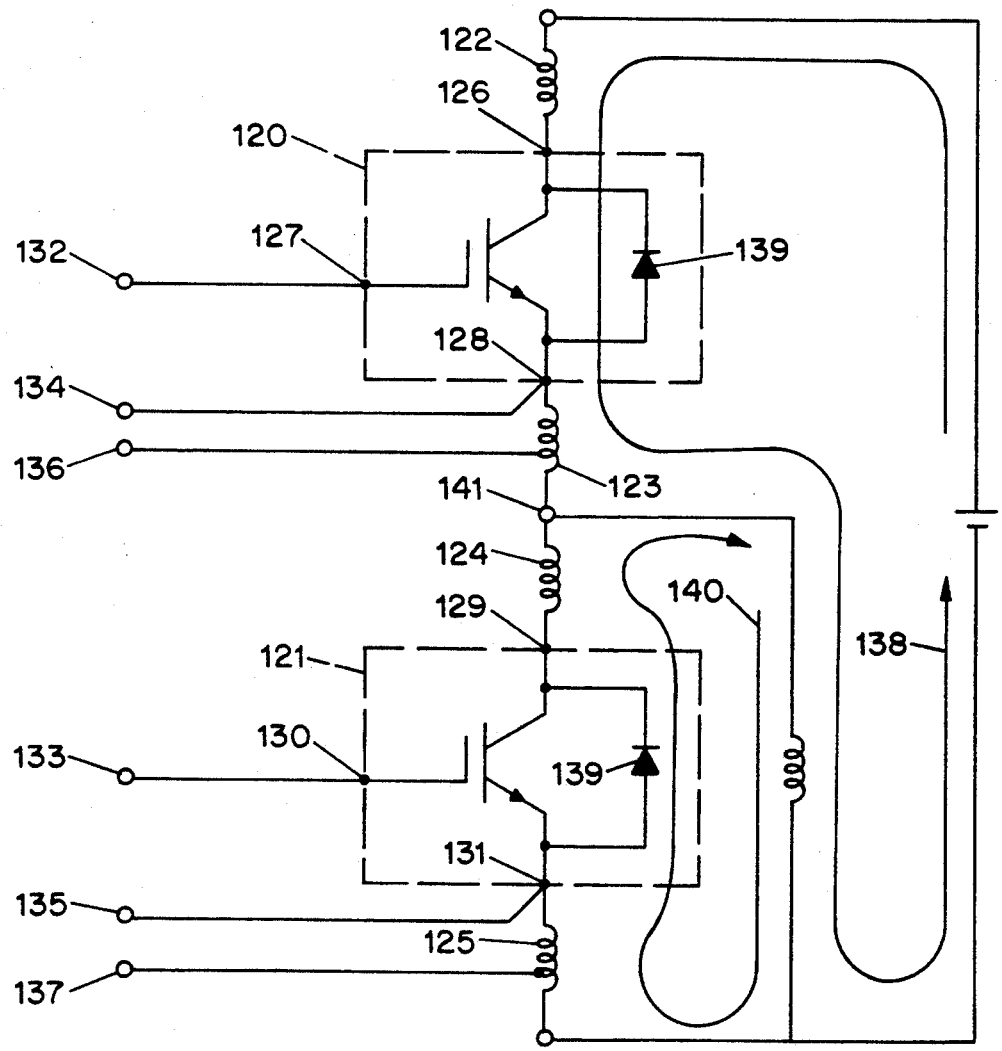
FIG. 5 is an equivalent circuit diagram for one phase of a three-phase inverter circuit.

A preferred further embodiment will be described with reference to FIG. 5 through 8. FIG. 5 shows an equivalent circuit of one phase of a three-phase inverter circuit. When IGBT elements 120 and 121 are packaged in a container, equivalent inductances 122 through 125 arise. The electrodes of the IGBT elements 120 and 121 are connected at parts 126 through 131. Parts 132 and 133 are gate terminals, parts 134 and 135 are auxiliary emitter terminals (this representing the conventional case in which auxiliary emitter terminals are away from the semiconductor element), and parts 136 and 137 are output terminals in accordance with the present invention.

The operation of this equivalent circuit can be understood as follows: Initially, a positive signal is applied to the gate terminal 132 of the upper element 120, and a negative signal is applied to the auxiliary emitter terminal 134. An opposing electromotive voltage now arises from a main-circuit current 138 and the inductance 123—which, however, does not act on the region between the gate terminal 132 and the auxiliary emitter terminal 134. As a result, the main-circuit current 138 rises rapidly in proportion with the signal at the gate electrode. At this time, the lower element 121 is in an off state, and a diode 139, which has been passing a return current 140, rapidly goes to an off state. As a result, a current surge is generated at the collector of element 121. At this point, element 121 may misfire because of a parasitic capacitance $C_{ge}$ between the gate and the emitter, and a rapid voltage increase may lead to a short circuit between the upper and lower arms.

In this case, if the auxiliary emitter terminal is removed from position 136, the opposing electromotive voltage resulting from the main-circuit current 138 and the inductance 123 will reduce the rate of increase of the signal between the gate and the emitter, thereby slowing down the rise of the main-circuit current and reducing the likelihood of a voltage surge. Upon turn-off, a reverse process takes place, allowing the main-circuit current to diminish more slowly, and reducing the likelihood of an over-voltage.

Figure 6:
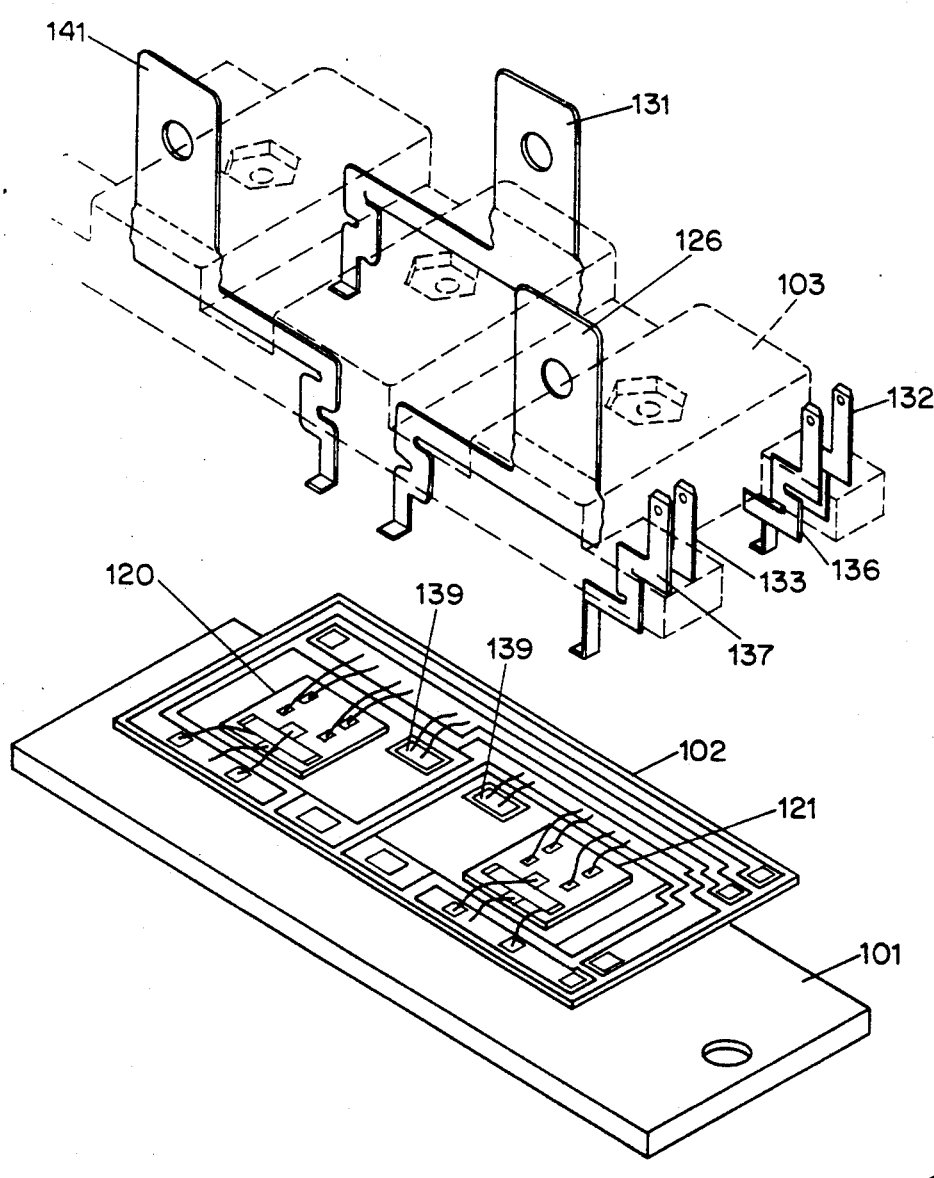
FIG. 6 is an exploded perspective view illustrating the package structure for the semiconductor device shown in the equivalent circuit diagram of FIG. 5.

FIG. 6 is an exploded perspective view, showing a package structure of a semiconductor device as represented by the equivalent circuit of FIG. 5. In FIG. 6, the IGBT elements 120 and 121, and a diode element 139 are affixed to a metal supporting plate 102. A current flows through the circuit and on to an external circuit through the main terminals 126, 131, 141 on a package component 103, and through the auxiliary terminals 132, 133, 136, 137. Part 101 is a base for attachment of the metal supporting plate 102.

Figure 7A:
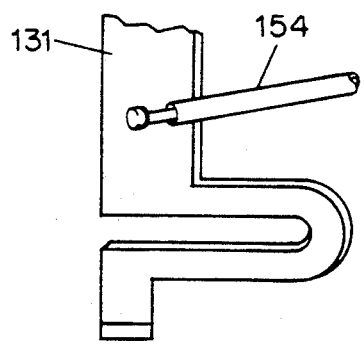
FIGS. 7(a-c) are enlarged detail drawings of a main emitter terminal.
Figure 7B:
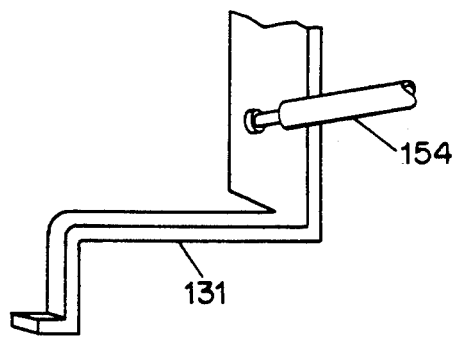
Figure 7C:
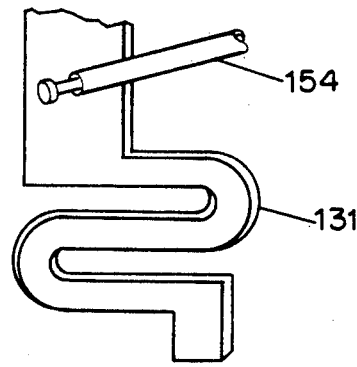

FIG. 7 shows alternative main emitter terminals 131 in further detail. By connecting a wire to an auxiliary emitter terminal, e.g. per FIG. 1, and further by changing the shape of a main emitter terminal, e.g. per FIG. 7, interconnection inductance can be optimized.

Figure 8:
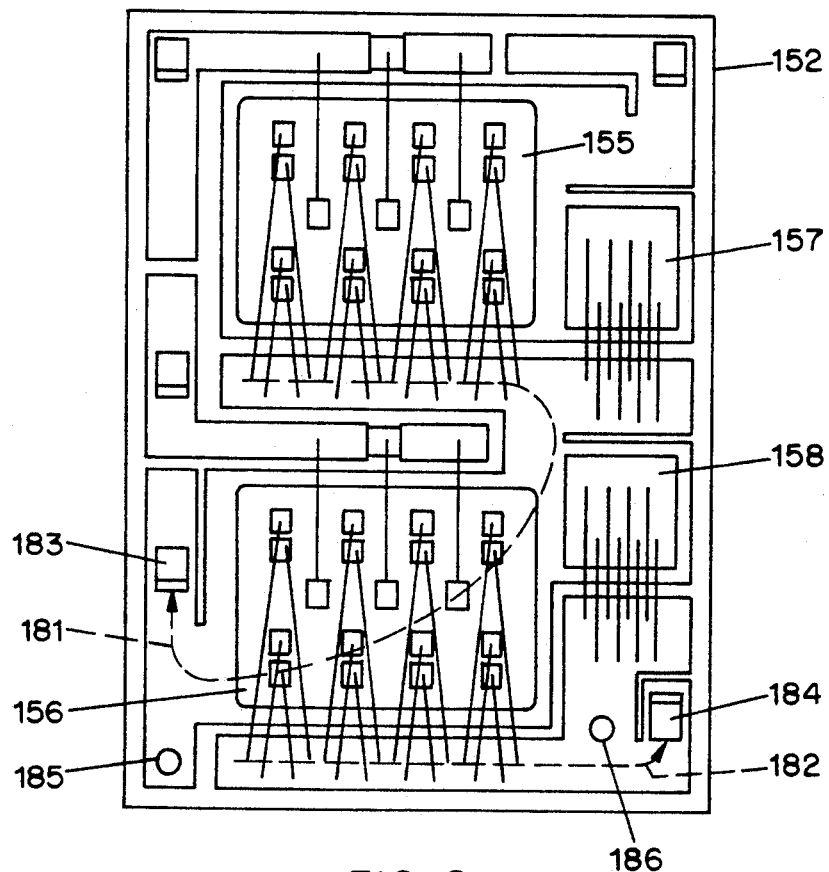
FIG. 8 is an illustration of a preferred further embodiment.

A preferred further embodiment utilizing the inductance of a conductive pattern is shown in FIG. 8. Parts 155 and 156 are IGBT elements, and 157 and 158 designate diode elements. Main currents 181 and 182 flow through a conductive pattern formed on a circuit constituting component 152, and flow to main terminals at positions 183 and 184. The output position of auxiliary terminals 185 and 186 should be in the vicinity of the main terminals 183 and 184 that utilize the inductance of the conductive pattern.

While the embodiments described above include IGBT's, it is clear that other types of switching elements can be similarly protected against excessive surges.

We claim:

1. A semiconductor device providing self-induced surge protection, comprising:
    a semiconductor element having first and second main electrodes and a control electrode;
    a main terminal;
    conductor means coupling the first main electrode to the main terminal and having an inductance which, during a change of state of the semiconductor element, produces an electromotive voltage;
    first auxiliary terminal means coupled to the control electrode, for coupling turn-on and turn-off control signals to the semiconductor element; and
    second auxiliary terminal means directly coupling the second auxiliary terminal to the main terminal, and the main terminal being configured to provide a predetermined inductance;
    whereby, under surge conditions during turn-on and turn-off of the semiconductor element, an opposing action due to said electromotive voltage diminishes the amplitude of the control signal, thereby providing self-induced protection against surge damage.

2. The semiconductor device of claim 1, wherein said semiconductor element comprises an insulated gate bipolar transistor.

3. The semiconductor device of claim 1, wherein said conductor means comprises a band conductor.

4. The semiconductor device of claim 1, wherein said conductor means comprises a conductive pattern.

5. The semiconductor device of claim 1, wherein said first auxiliary terminal means comprises:
    an auxiliary terminal for receiving said control signals; and
    a lead wire for coupling said auxiliary terminal to said control electrode.

6. The semiconductor device of claim 1 wherein said main terminal comprises at least one bend.

7. The semiconductor device of claim 1, further comprising an additional semiconductor element connected in series with said semiconductor element, providing self-induced surge protection in a three phase inverter circuit.

8. A semiconductor switching device providing self-induced surge protection during switching, comprising:
    a semiconductor element having first and second main electrode means for carrying a main current, and control electrode means for switching the semiconductor device on and off;
    a main terminal;
    conductor means coupling the first main electrode to the main terminal and having an inductance which, during switching of the main current, produces an electromotive voltage;
    first auxiliary terminal means coupled to the control electrode, for coupling a switching-control signal to the semiconductor element; and
    second auxiliary terminal means directly coupling the second auxiliary terminal to the main terminal, and the main terminal being configured to provide a predetermined inductance;
    whereby, under surge conditions during switching of the semiconductor element, an opposing action due to said electromotive voltage diminishes the amplitude of the switching-control signal, thereby providing self-induced protection against surge damage.

9. The semiconductor switching device of claim 8, wherein said semiconductor element comprises an insulated gate bipolar transistor.

10. The semiconductor switching device of claim 8, wherein said conductor means comprises a band conductor.

11. The semiconductor switching device of claim 8 wherein said conductor means comprises a conductive pattern.

12. The semiconductor switching device of claim 8, wherein said first auxiliary terminal means comprises:
    an auxiliary terminal for receiving said control signals; and
    a lead wire for coupling said auxiliary terminal to said control electrode.

13. The semiconductor switching device of claim 8, wherein said main terminal comprises at least one bend.

14. The semiconductor switching device of claim 8, further comprising an additional semiconductor element connected in series with said semiconductor element, providing self-induced surge protection in a three phase inverter circuit.

15. A semiconductor device providing self-induced surge protection, comprising:
    a semiconductor element having first and second main electrodes and a control electrode;
    a diode connected in parallel with the semiconductor element;
    a main terminal;
    conductor means coupling the first main electrode to the main terminal and having an inductance which, during a change of state of the semiconductor element, produces an electromotive voltage;
    first auxiliary terminal means coupled to the control electrode, for coupling a control signal to the semiconductor element;
    second auxiliary terminal means coupled to a point of the conductor means, selected such that, under surge conditions during turn-on and turn-off of the semiconductor element, an opposing action due to said electromotive voltage diminishes the amplitude of the control signal, thereby providing self-induced protection against surge damage.

* * * * *

UNITED STATES PATENT AND TRADEMARK OFFICE
CERTIFICATE OF CORRECTION

PATENT NO. : 5,164,877

DATED : November 17, 1992

INVENTOR(S) : Furuhata et al.

It is certified that error appears in the above-identified patent and that said Letters Patent is hereby corrected as shown below:

Column 5, line 11, "a change of state" should read --turn-on and turn-off;

Column 6, line 2, "electrode" should read --electrode means--.

Signed and Sealed this

Thirtieth Day of November, 1993

Attest:

BRUCE LEHMAN

Attesting Officer

Commissioner of Patents and Trademarks